(12) United States Patent
Cheng et al.

(10) Patent No.: US 9,786,794 B2
(45) Date of Patent: Oct. 10, 2017

(54) METHOD OF FABRICATING MEMORY STRUCTURE

(71) Applicant: MACRONIX International Co., Ltd., Hsinchu (TW)

(72) Inventors: Cheng-Hsien Cheng, Hsinchu (TW); Wen-Jer Tsai, Hsinchu (TW); Shih-Guei Yan, Hsinchu (TW); Chih-Chieh Cheng, Hsinchu (TW); Jyun-Siang Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 55 days.

(21) Appl. No.: 15/096,044

(22) Filed: Apr. 11, 2016

(65) Prior Publication Data

US 2016/0225911 A1    Aug. 4, 2016

Related U.S. Application Data

(60) Continuation of application No. 14/313,614, filed on Jun. 24, 2014, now Pat. No. 9,349,878, which is a (Continued)

(51) Int. Cl.
*H01L 29/788* (2006.01)
*H01L 21/28* (2006.01)
(Continued)

(52) U.S. Cl.
CPC .... *H01L 29/7887* (2013.01); *H01L 21/28273* (2013.01); *H01L 27/11551* (2013.01);
(Continued)

(58) Field of Classification Search
CPC .......... H01L 29/7887; H01L 29/42332; H01L 21/28273; H01L 29/66825; H01L 29/792;
(Continued)

(56) References Cited

U.S. PATENT DOCUMENTS 7,512,012 B2 * 3/2009 Kuo .................. H01L 21/28282
257/314
7,723,789 B2 * 5/2010 Lin .................... H01L 21/28282
257/315

(Continued)

*Primary Examiner* — Khiem D Nguyen
*Assistant Examiner* — Pauline Vu
(74) *Attorney, Agent, or Firm* — J.C. Patents

(57) ABSTRACT

A memory structure includes a memory cell, and the memory cell includes following elements. A first gate is disposed on a substrate. A stacked structure includes a first dielectric structure, a channel layer, a second dielectric structure and a second gate disposed on the first gate, a first charge storage structure disposed in the first dielectric structure and a second charge storage structure disposed in the second dielectric structure. The first charge storage structure is a singular charge storage unit and the second charge storage structure comprises two charge storage units which are physically separated. A channel output line physically connected to the channel layer. A first dielectric layer is disposed on the first gate at two sides of the stacked structure. A first source or drain and a second source or drain are disposed on the first dielectric layer and located at two sides of the channel layer.

18 Claims, 9 Drawing Sheets

Related U.S. Application Data division of application No. 13/166,144, filed on Jun. 22, 2011, now Pat. No. 8,796,754.

(51) Int. Cl.
H01L 29/423 (2006.01)
H01L 29/66 (2006.01)
H01L 29/792 (2006.01)
H01L 27/11551 (2017.01)
H01L 27/11578 (2017.01)

(52) U.S. Cl.
CPC .. H01L 27/11578 (2013.01); H01L 29/42332 (2013.01); H01L 29/66825 (2013.01); H01L 29/792 (2013.01); H01L 29/7923 (2013.01)

(58) Field of Classification Search
CPC ......... H01L 27/11551; H01L 27/11578; H01L 29/7923; H01L 29/66833; H01L 21/28282
See application file for complete search history.

(56) References Cited

U.S. PATENT DOCUMENTS

| | | | | |
|---|---|---|---|---|
| 8,987,803 B2* | 3/2015 | Chae | H01L 27/1157 | 257/200 |
| 2006/0205148 A1* | 9/2006 | Deppe | H01L 21/28282 | 438/257 |
| 2007/0212832 A1* | 9/2007 | Orlowski | H01L 29/7887 | 438/257 |
| 2008/0087941 A1* | 4/2008 | Yun | H01L 27/115 | 257/324 |
| 2009/0001450 A1* | 1/2009 | Kim | H01L 21/28273 | 257/324 |
| 2009/0039405 A1* | 2/2009 | Cheng | H01L 21/28273 | 257/311 |
| 2009/0121280 A1* | 5/2009 | Koh | H01L 21/28273 | 257/324 |
| 2009/0242966 A1* | 10/2009 | Son | H01L 27/11578 | 257/324 |
| 2010/0117141 A1* | 5/2010 | Shin | G11C 5/02 | 257/326 |
| 2010/0133606 A1* | 6/2010 | Jang | H01L 27/11551 | 257/329 |
| 2010/0155810 A1* | 6/2010 | Kim | H01L 27/11548 | 257/316 |
| 2010/0155818 A1* | 6/2010 | Cho | H01L 27/11551 | 257/324 |
| 2010/0207185 A1* | 8/2010 | Lee | H01L 21/28282 | 257/314 |
| 2010/0248439 A1* | 9/2010 | Chung | H01L 27/11582 | 438/287 |
| 2011/0002178 A1* | 1/2011 | Hwang | H01L 27/11578 | 365/189.011 |
| 2011/0059595 A1* | 3/2011 | Jung | H01L 29/66833 | 438/430 |
| 2011/0062510 A1* | 3/2011 | Joo | H01L 27/11578 | 257/324 |
| 2011/0298037 A1* | 12/2011 | Choe | G11C 16/0483 | 257/324 |
| 2012/0001247 A1* | 1/2012 | Alsmeier | H01L 27/11551 | 257/316 |
| 2012/0001249 A1* | 1/2012 | Alsmeier | H01L 27/11551 | 257/319 |
| 2012/0001250 A1* | 1/2012 | Alsmeier | H01L 27/11551 | 257/319 |
| 2012/0001252 A1* | 1/2012 | Alsmeier | H01L 27/11551 | 257/321 |

* cited by examiner

METHOD OF FABRICATING MEMORY STRUCTURE

CROSS-REFERENCE TO RELATED APPLICATION

This application is a continuation application of and claims the priority benefit of U.S. application Ser. No. 14/313,614, filed on Jun. 24, 2014, now allowed. The prior application Ser. No. 14/313,614 is a divisional application of and claims the priority benefit of U.S. application Ser. No. 13/166,144, filed on Jun. 22, 2011, U.S. Pat. No. 8,796,754. The entirety of each of the above-mentioned patent applications is hereby incorporated by reference herein and made a part of this specification.

BACKGROUND OF THE INVENTION

Field of the Invention

The invention related to a memory structure and a fabricating method thereof. More particularly, the invention relates to a memory structure having a plurality of charge storage units which is physically separated and a fabricating method thereof.

Description of Related Art

A memory is a semiconductor device designed to store information or data. As micro-processors become more functional, the programs and operations performed by software increase as well. Thus, the demand for high capacity memory becomes higher. In various memory products, non-volatile memory such as electrically erasable programmable read only memory (EEPROM) allows multiple data programming, reading, and erasing operations. Here, the data stored therein are saved even after the memory has been disconnected. According to the advantages mentioned above, EEPROM has become a memory widely adopted in personal computers and electronic apparatuses.

In a typical EEPROM, a floating gate and a control gate are fabricated using doped polysilicon. When the memory is being programmed, electrons injected into the floating gate then distribute evenly in the entire polysilicon floating gate. However, when defects are present in a tunnel oxide layer disposed under the polysilicon floating gate, current leakage of devices then occurs easily, thereby affecting the reliability of devices.

As a result, in order to prevent current leakage in EEPROM, a conventional method is to replace the polysilicon floating gate with a gate structure having a non-conductive charge storage layer. Another advantage of replacing the polysilicon floating gate with the charge storage layer is that when the device is being programmed, electrons are only stored locally in the charge storage layer above a source or a drain. Therefore, a source region and a control gate at one end of a stacked gate are applied with a voltage respectively during the programming so as to generate electrons with Gaussian distribution in the charge storage layer close to the source region. Moreover, a drain region at one end of the stacked gate and the control gate are also applied with a voltage respectively to generate electrons with Gaussian distribution in the charge storage layer close to the drain region. Consequently, by changing the voltage applied in the control gate and the source/drain regions at the two sides thereof, two groups of electrons with Gaussian distribution, one group of electrons with Gaussian distribution, or no electrons can be present in a single charge storage layer. Accordingly, the flash memory replacing the floating gate with the charge storage layer can be written into a single memory cell in four states and is a flash memory with a 2 bits/cell storage.

Nevertheless, along with the increasing integrity of the semiconductor device, the dimension of the non-volatile memory is miniaturized constantly. As the miniaturization of the gate length leads to the approximation of two charge storage units located on the left and right in the same memory cell, a severe second bit effect then occurs and easily results in erroneous reading. In addition, since the source region and the drain region are miniaturized, the source region and the drain region fail to block the secondary hot electrons generated when the selected memory cell is programmed. The second hot electrode is thus injected into the adjacent memory cell to generate program disturbance and thereby lowering the reliability of memory device.

SUMMARY OF THE INVENTION

Accordingly, an embodiment of the invention provides a memory structure capable of solving the reading error caused by the second bit effect.

An embodiment of the invention provides a memory structure including a memory, and the memory cell includes the following elements. A first gate is disposed on a substrate. A stacked structure includes a first dielectric structure, a channel layer, a second dielectric structure and a second gate disposed on the first gate, a first charge storage structure disposed in the first dielectric structure, and a second charge storage structure disposed in the second dielectric structure. The first charge storage structure is a singular charge storage unit and the second charge storage structure comprises two charge storage units which are physically separated. A channel output line physically connected to the channel layer. A first dielectric layer is disposed on the first gate at two sides of the stacked structure. A first source or drain and a second source or drain are disposed on the first dielectric layer and located at two sides of the channel layer.

According to an embodiment of the invention, in the memory structure aforementioned, the two charge storage units in the second charge storage structure are isolated from each other through the second dielectric structure, and the first dielectric structure includes a second dielectric layer and a third dielectric layer, for example. The second dielectric layer is disposed between the first gate and the first charge storage structure and the third dielectric layer is disposed between the first charge storage structure and the channel layer.

According to an embodiment of the invention, in the memory structure aforementioned, the memory structure comprises stacked memory cells.

According to an embodiment of the invention, in the memory structure aforementioned, the first gate is, for example, a first word line and the second gate is, for example, a portion of a second word line, and the second word line does not need to be aligned with the first word line.

Another embodiment of the invention provides a memory structure including a memory, and the memory cell includes the following elements. A first gate is disposed on a substrate. A stacked structure includes a first dielectric structure, a channel layer, a second dielectric structure and a second gate disposed on the first gate, a first charge storage structure disposed in the first dielectric structure, and a second charge storage structure disposed in the second dielectric structure. The first charge storage structure comprises two charge storage units which are physically separated and the second charge storage structure is a singular charge storage unit. A channel output line physically connected to the channel layer. A first dielectric layer is disposed on the first gate at two sides of the stacked structure. A first source or drain and a second source or drain are disposed on the first dielectric layer and located at two sides of the channel layer.

According to another embodiment of the invention, in the memory structure aforementioned, the two charge storage units in the first charge storage structure are isolated from each other through the first dielectric structure, and the second dielectric structure includes a fourth dielectric layer and a fifth dielectric layer, for example. The fourth dielectric layer is disposed between the channel layer and the second charge storage structure and the fifth dielectric layer is disposed between the second charge storage structure and the second gate.

According to another embodiment of the invention, in the memory structure aforementioned, the memory structure comprises stacked memory cells.

According to another embodiment of the invention, in the memory structure aforementioned, the first gate is, for example, a first word line and the second gate is, for example, a portion of a second word line, and the second word line does not need to be aligned with the first word line.

In light of the foregoing, in the memory structure disclosed in one embodiment of the invention, as at least one of the first charge storage structure and the second charge storage structure includes two charge storage units which are physically separated, the reading error caused by the second bit effect can be prevented and the programming disturbance led by the secondary hot electrode can be reduced.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DETAILED DESCRIPTION OF DISCLOSED EMBODIMENTS

FIGS. 1A to 1H are cross-sectional diagrams illustrating a flow chart for fabricating a memory structure according to a first embodiment of the invention.

Figure 1A:
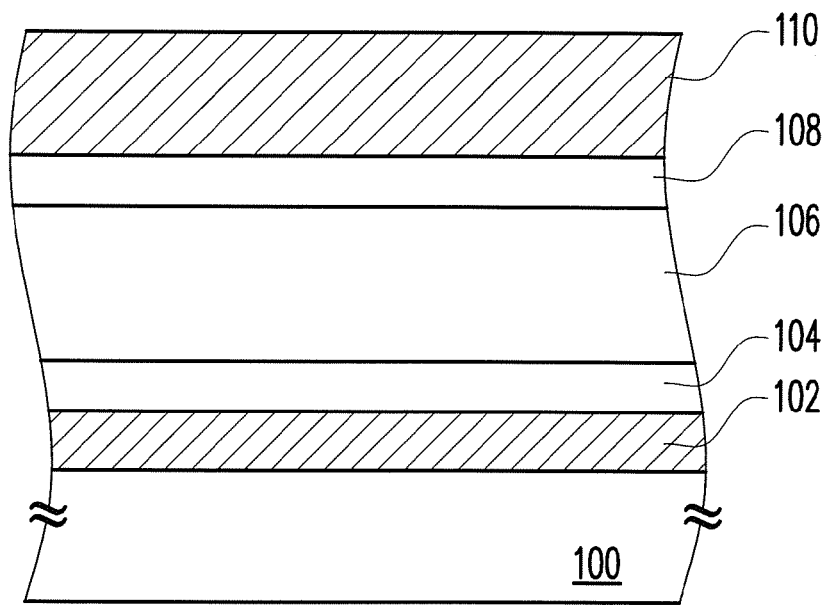
FIGS. 1A to 1H are cross-sectional diagrams illustrating a flow chart for fabricating a memory structure according to a first embodiment of the invention.

Referring to FIG. 1A, a gate 102 is first formed on a substrate 100. The gate 102 is, for example, an N-type doped region and the substrate 100 is, for example, a P-type doped substrate. The N-type gate 102 and the P-type substrate 100 have contrary doping types and can therefore block charges from communicating therebetween. In another embodiment, the substrate 100 can also be a P-type well region (not shown) located in an N-type well region (not shown), so that the gate 102 is formed on the P-type well region on the substrate 100. When the gate 102 is the N-type doped region, a method of forming the gate 102 includes implanting a dopant in the substrate 100 using an ion implantation method, for instance.

In another embodiment, the gate 102 is a doped polysilicon gate. When the gate 102 is a doped polysilicon gate, an isolation dielectric layer is further formed between the substrate 100 and the gate 102 to separate the substrate 100 and the gate 102.

Thereafter, a dielectric material layer 104, a semiconductor material layer 106, a dielectric material layer 108, and a gate material layer 110 are sequentially formed on the gate 102. The dielectric material layer 104 is fabricated using silicon oxide, for instance. The semiconductor material layer 106 is fabricated with, for example, epitaxy silicon, polysilicon, or amorphous silicon. The dielectric material layer 108 is fabricated using silicon oxide, for instance. The gate material layer 110 is fabricated using conductive material such as doped polysilicon, metal, or so on, for example. The dielectric material layer 104, the semiconductor material layer 106, the dielectric material layer 108, and the gate material layer 110 are formed using, for example, a chemical vapor deposition (CVD) method or a physical vapor deposition method (PVD).

Figure 1B:
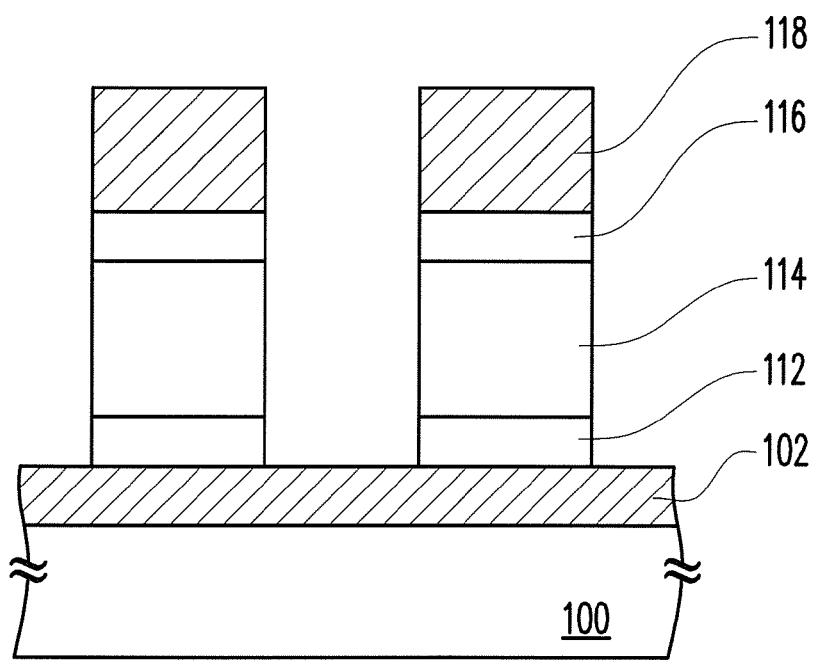

Referring to FIG. 1B, the dielectric material layer 104, the semiconductor material layer 106, the dielectric material layer 108, and the gate material layer 110 are patterned to form a dielectric layer 112, a channel layer 114, a dielectric layer 116, and a gate 118 on the gate 102 sequentially. The dielectric material layer 104, the semiconductor material layer 106, the dielectric material layer 108, and the gate material layer 110 are patterned by performing a photolithography process and an etching process to the layer aforementioned, for example.

Figure 1C:
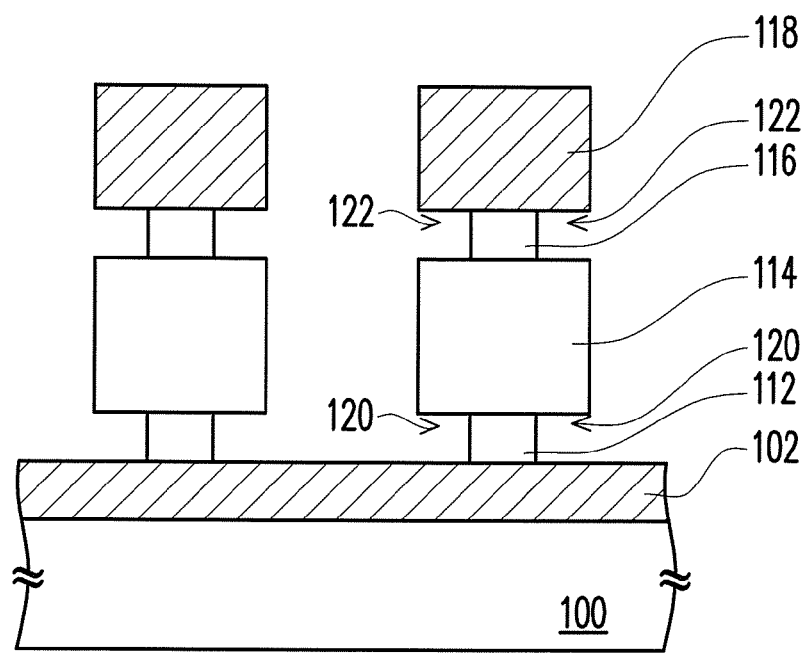

Referring to FIG. 1C, two sides of the dielectric layer 112 and two sides of the dielectric layer 116 are removed to form an opening 120 between the channel layer 114 and the gate 102 and an opening 122 between the gate 118 and the channel layer 114. A portion of the dielectric layer 112 and a portion of the dielectric layer 116 are removed using, for example, a wet etching method.

Figure 1D:
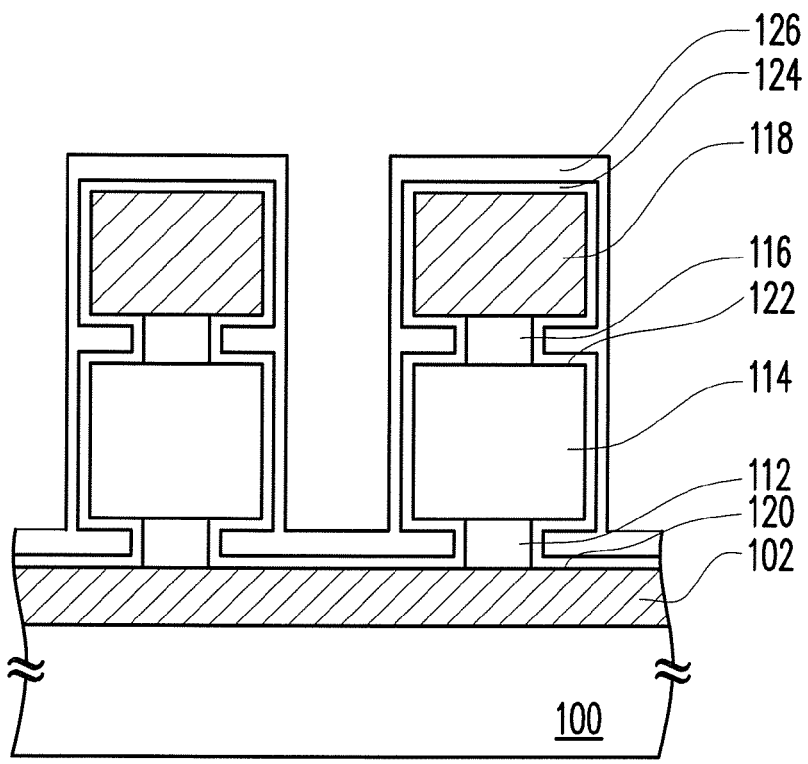

Afterwards, referring to FIG. 1D, a dielectric material layer 124 is formed on surfaces of the gate 102, the dielectric layer 112, the channel layer 114, the dielectric layer 116, and the gate 118. The dielectric material layer 124 is fabricated using silicon oxide, for instance. The dielectric material layer 124 is formed, for example, with a thermal oxidation method.

A charge storage material layer 126 filling the opening 120 and the opening 122 is then formed on the dielectric material layer 124. The charge storage material layer 126 is fabricated using silicon nitride, doped polysilicon, or nano grain, for example. The charge storage material layer 126 is formed using a CVD method, for example.

Figure 1E:
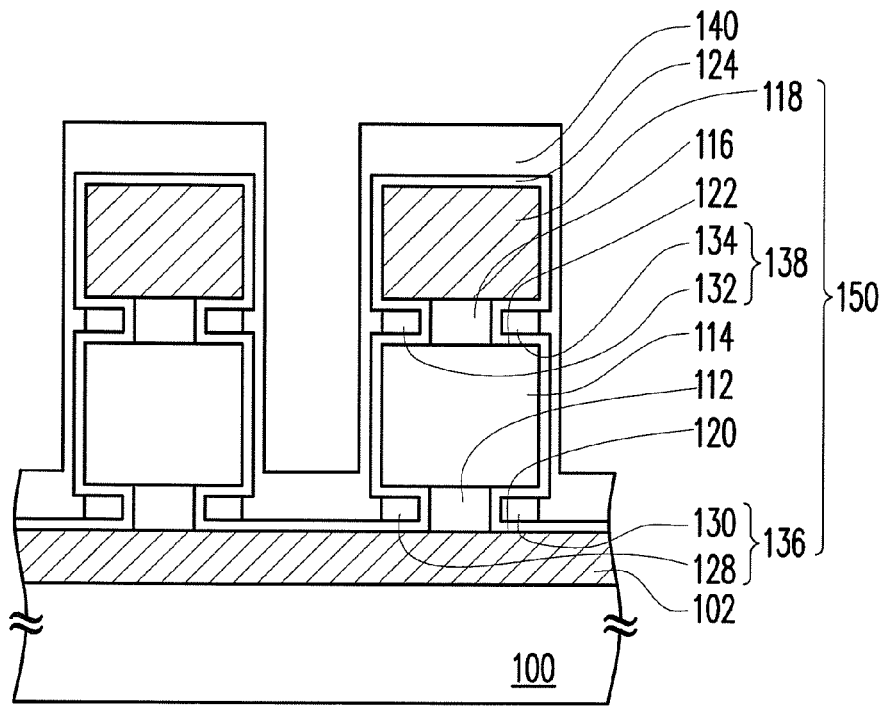

Subsequently, referring to FIG. 1E, the charge storage material layer 126 located outside of the opening 120 and the opening 122 is removed to form a plurality of charge storage units 128, 130 filling the opening 120 and a plurality of charge storage units 132, 134 filling the opening 122. In the present embodiment, the charge storage units 128, 130 which are physically separated form a charge storage structure 136, and the charge storage units 132, 134 which are physically separated form a charge storage structure 138. A portion of the charge storage material layer 126 is removed using, for example, a dry etching method, a wet etching method, or a combination thereof.

Next, a dielectric material layer 140 is formed on a surface of the dielectric material layer 124. The dielectric material layer 140 is fabricated using silicon oxide, for instance. The dielectric material layer 140 is formed using a CVD method, for example.

Figure 1F:
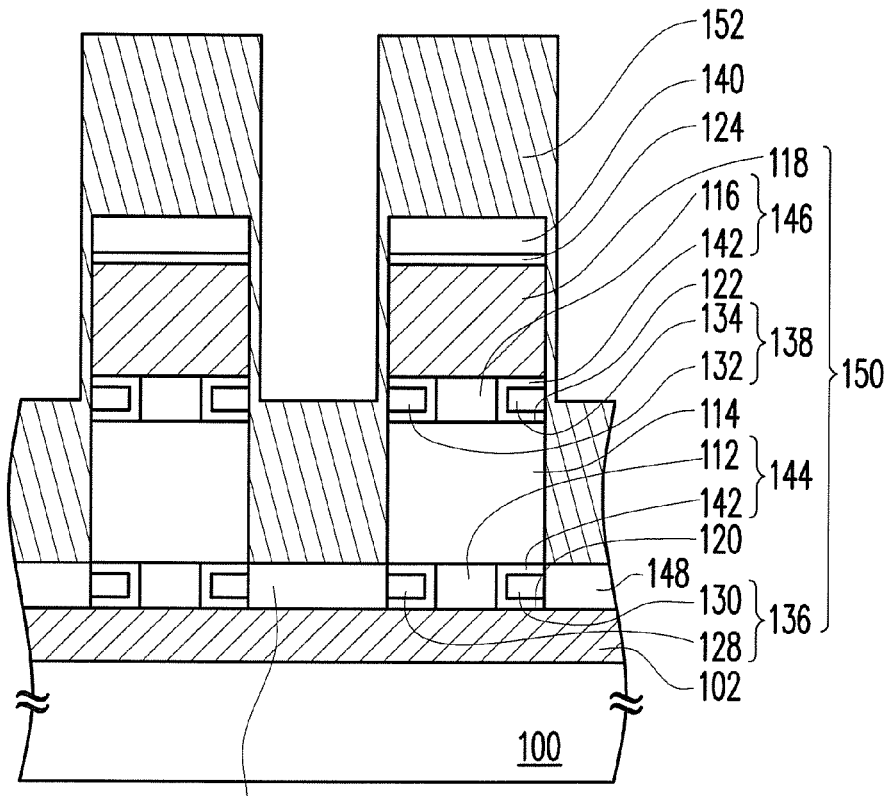

Referring to FIG. 1F, the dielectric material layer 140 and the dielectric material layer 124 located outside of the opening 120 and the opening 122 are removed. The dielectric material layer 124 and the dielectric material layer 140 located above the gate 102 are left outside of the opening 120 and the opening 122 to form a dielectric layer 148. Consequently, a dielectric layer 142 is formed by the dielectric material layer 124 located on surfaces of the opening 120 and the opening 122. A portion of the dielectric material layer 140 and a portion of the dielectric material layer 124 are removed using, for example, a dry etching method. At this time, a portion of the dielectric material layer 124 and a portion of the dielectric material layer 140 may remain above the gate 118.

Here, the dielectric layer 142 and the dielectric layer 112 located on the surface of the opening 120 form a dielectric structure 144 for separating the charge storage units 128, 130 in the charge storage structure 136. The charge storage structure 136, the channel layer 114, and the gate 102 are thus separated. The dielectric layer 142 and the dielectric layer 116 located on the surface of the opening 122 form a dielectric structure 146 for separating the charge storage units 132, 134 in the charge storage structure 136. As a result, the charge storage structure 138, the channel layer 114, and the gate 118 are separated.

In addition, a stacked structure 150 disposed on the gate 102 is formed by the dielectric structure 144, the channel layer 114, the dielectric structure 146, and the gate 118, the charge storage structure 136 disposed in the dielectric structure 144, and the charge storage structure 138 disposed in the dielectric structure 146. Although the stacked structure 150 is fabricated with the method above-mentioned, the methods of fabricating the stacked structure 150 and the elements therein are not limited thereto.

Moreover, the dielectric layer 148 located on the gate 102 at two sides of the stacked structure 150 is configured to isolate the gate 102 from a source or drain subsequently formed on the dielectric layer 148. The thickness of the dielectric layer 148 should be sufficient for isolating the gate 102 from the source or drain subsequently formed on the dielectric layer 148. For example, the thickness of the dielectric layer 148 is about the thickness of the dielectric structure 144, for instance.

A conductor layer 152 is then formed on the dielectric layer 148 and the conductor layer 152 covers the stacked structure 150. The conductor layer 152 is fabricated using doped polysilicon or metal, for example. The conductor layer 152 is formed using a CVD method, for example.

Figure 1G:
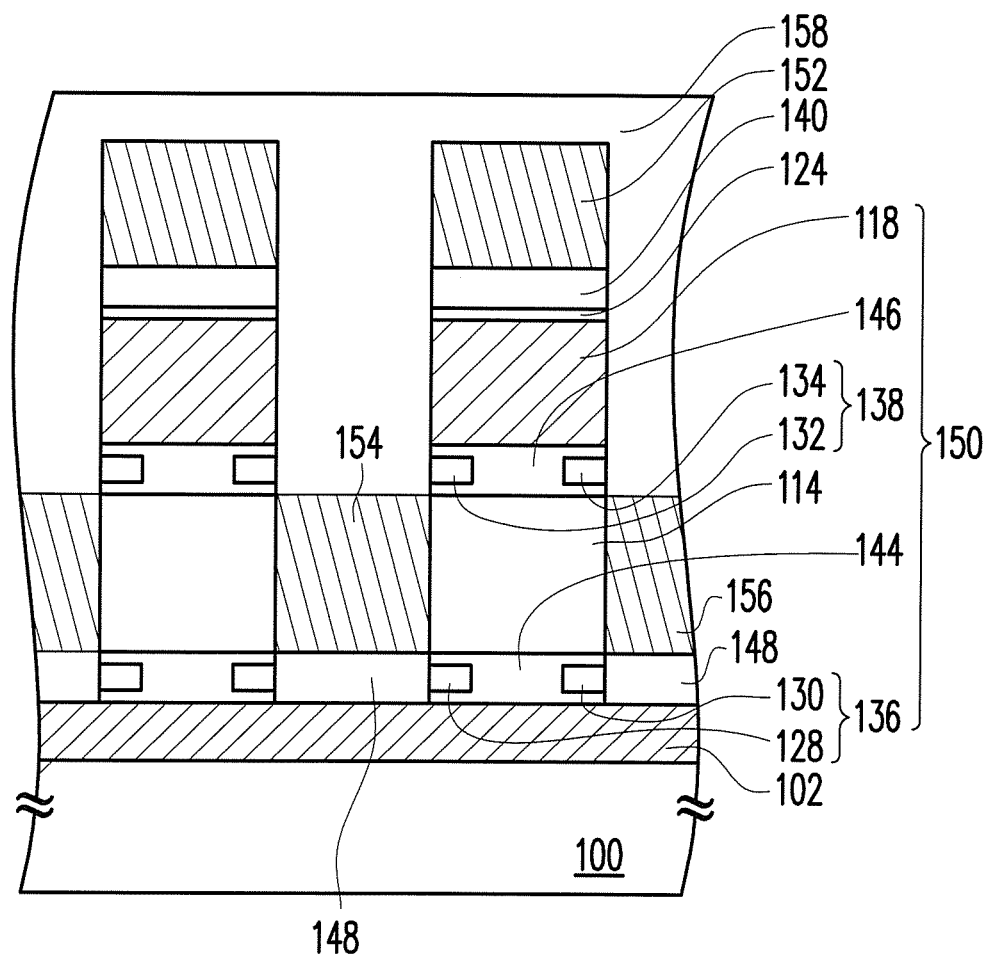

Referring to FIG. 1G, a portion of the conductor layer 152 is removed to form a source or drain 154 and a source or drain 156 located at two sides of the channel layer 114. Herein, the thicknesses of the source or drain 154, the source or drain 156, and the channel layer 114 are substantially the same, for instance. A portion of the conductor layer 152 is removed using a dry etching method, for example. At this time, the conductor layer 152 located on a side wall of the dielectric structure 146, the gate 118, the dielectric material layer 124, and the dielectric material 140 is removed to prevent the gate 118 from electrically connecting with the source or drain 154 and the source or drain 156. Additionally, a portion of the conductor layer 152 can be remained on the dielectric material layer 140.

Further, the dielectric material layer 158 is formed on the source or drain 154 and the source or drain 156, and the dielectric material layer 158 covers the stacked structure 150. The dielectric material layer 158 is fabricated using silicon oxide, for instance. The dielectric material layer 158 is formed using a CVD method, for example.

Figure 1H:
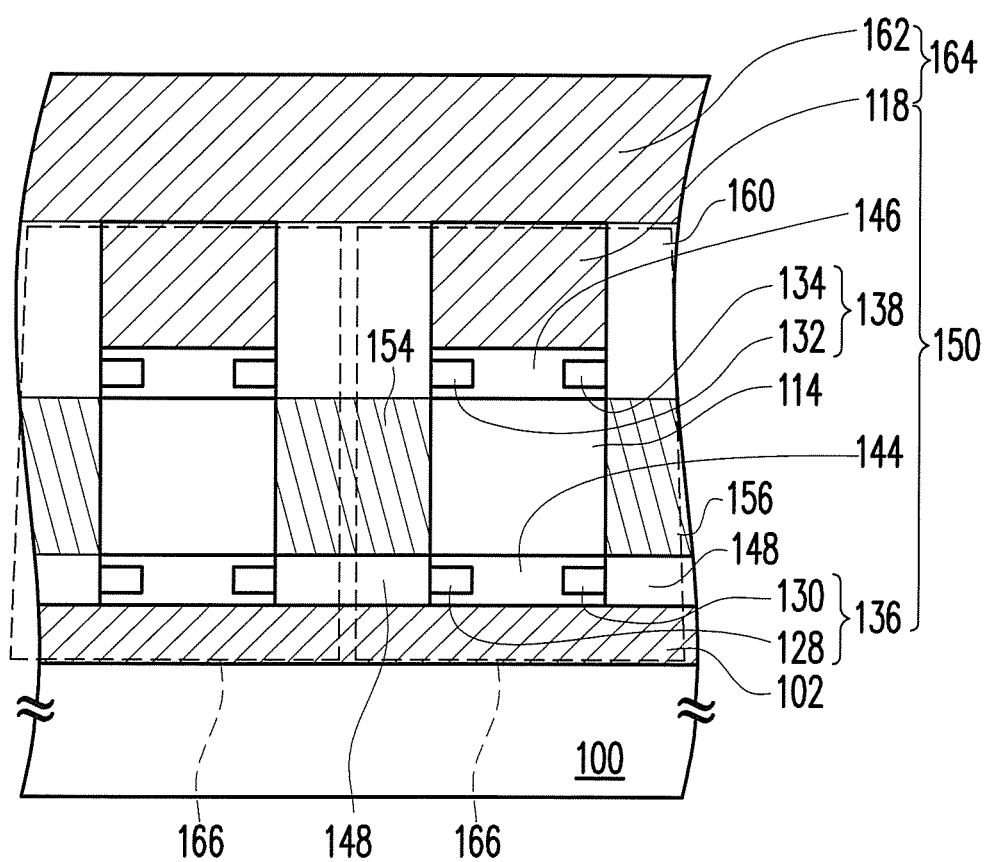

Referring to FIG. 1H, a portion of the dielectric material layer 158 is removed until the gate 118 is exposed so as to form a dielectric layer 160 located at two sides of the gate 118 on the source or drain 154 and the source or drain 156. While removing a portion of the dielectric material layer 158, the dielectric material layer 124, the dielectric material layer 140 located above the gate 118, and the conductor layer 152 remained on the dielectric material layer 140 are removed simultaneously. A portion of the dielectric material layer 158, the dielectric material layer 140, the dielectric material layer 124, and a portion of the conductor layer 152 remained on the dielectric material layer 140 are removed with a chemical mechanical polishing method, for instance.

Subsequently, a connecting lead 162 is formed on the gate 118, and the gate 118 forms a word line 164 with the connecting lead 162. The connecting lead 162 is formed by, for example, foiling a conductor layer (not shown) on the gate 118 using a CVD method and then patterning the conductor layer. The conductor layer is fabricated using doped polysilicon or metal, for example.

Accordingly, the fabricating method of a memory structure illustrated in the above embodiment can be integrated with the conventional fabrication. As a consequence, the fabrication complexity can be decreased effectively.

Figure 2:
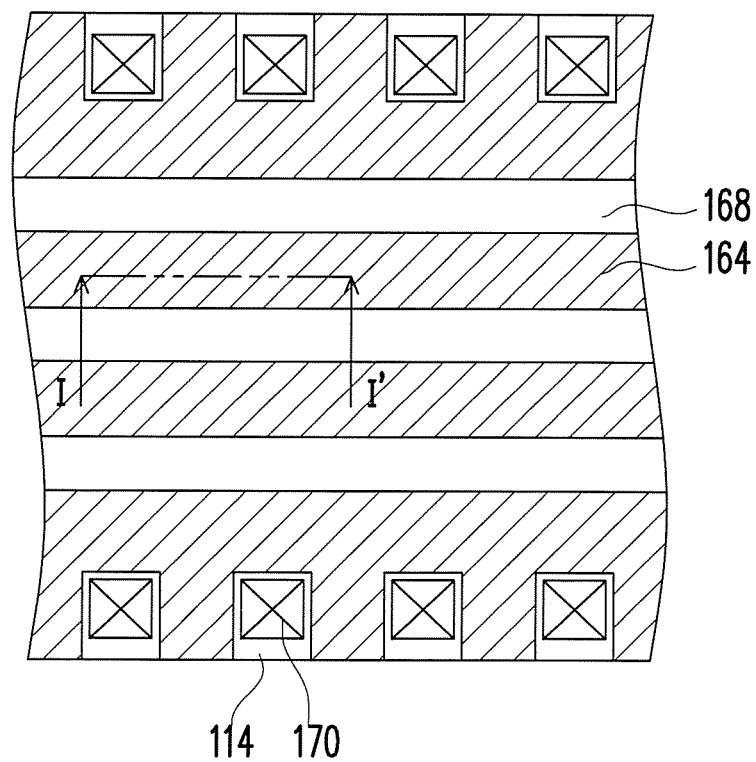
FIG. 2 shows a top view of FIG. 1H.

In the following, a memory structure disclosed in a first embodiment is illustrated with FIG. 1H. FIG. 2 shows a top view of FIG. 1H. FIG. 1H is a cross-sectional view taken along line I-I' in FIG. 2.

Referring to FIGS. 1H and 2 simultaneously, a memory structure includes a plurality of memory cells 166. Each of the memory cells 166 includes a gate 102, a stacked structure 150, a dielectric layer 148, a source or drain 154, and a source or drain 156. Additionally, the memory structure further includes a dielectric layer 160, a connecting lead 162, and a channel output line 170. The connecting lead 162 is configured to connect the gate 118 in the stacked structure 150 to form a word line 164. The word lines 164 are separated using an isolation structure 168. Herein, each of the word lines 164 corresponds to a word line formed by the gate 102, and the word lines formed by the gate 102 are separated using the isolation structure (not shown). The word lines 164 do not need to be aligned with the word lines formed by the gate 102. The channel output line 170 is connected to the channel layer 114 for outputting holes accumulated in the channel layer 114 so as to prevent the floating-body effect, thereby preventing difficult programming due to increasing potential of the channel layer. The channel output line 170 is fabricated with conductive material such as metal and so on, for example. In addition, the disposition, material, fabricating method, and function of other elements in the memory structure have been fully described in the above embodiment and the details are thus omitted hereinafter.

Accordingly, as the charge storage units 128, 130 in the charge storage structure 136 are physically separated and the charge storage units 132, 134 in the charge storage structure 138 are physically separated, when the length of the gate is miniaturized, the second bit effect between the two charge storage units 128, 130 (or 132, 134) on the left and right sides of the memory cell 166 is prevented, and reading errors caused therefrom are thus prevented. Furthermore, as the charge storage units 128, 130 in the charge storage structure 136 are physically separated and the charge storage units 132, 134 in the charge storage structure 138 are physically separated, when the source or drain 154 and the source or drain 156 are miniaturized, the number of secondary hot electrodes injected into the adjacent memory cell 166 is decreased. Consequently, the programming disturbance is reduced so as to enhance the reliability of the memory device.

In the following, a memory structure disclosed in a first embodiment is illustrated with FIG. 1H.

When a programming operation is performed to the charge storage unit 134 in the memory cell 166, a first voltage is applied at the gate 118, a second voltage is applied at the gate 102, a third voltage is applied at the source or drain 154, and a fourth voltage is applied at the source or drain 156. Herein, the first voltage is higher than the second voltage, and the fourth voltage is higher than the third voltage. The first voltage is, for example, 11 V, the second voltage is, for example, 0 V, the third voltage is, for example, 0 V, and the fourth voltage is, for instance, 4 V. However, the operation voltages of the programming operation in the invention are not limited thereto.

When a reading operation is performed to the charge storage unit 134 in the memory cell 166, a fifth voltage is applied at the gate 118, a sixth voltage is applied at the gate 102, a seventh voltage is applied at the source or drain 154, and an eighth voltage is applied at the source or drain 156. Herein, the fifth voltage is higher than the sixth voltage, and the seventh voltage is higher than the eighth voltage. The fifth voltage is, for example, 3 V, the sixth voltage is, for example, 0 V, the seventh voltage is, for example, 1.6 V, and the eighth voltage is, for instance, 0 V. However, the operation voltages of the reading operation in the invention are not limited thereto.

When an erasing operation is performed to the charge storage unit 134 in the memory cell 166, a ninth voltage is applied at the gate 118, a tenth voltage is applied at the gate 102, an eleventh voltage is applied at the source or drain 154, and a twelfth voltage is applied at the source or drain 156. Herein, the tenth voltage is higher than the ninth voltage, the twelfth voltage is higher than the eleventh voltage, and the ninth voltage and the twelfth voltage are electrically opposite. The ninth voltage is, for example, −6 V, the tenth voltage is, for example, 0 V, the eleventh voltage is, for example, 0 V, and the twelfth voltage is, for instance, 4 V. However, the operation voltages of the erasing operation in the invention are not limited thereto.

Additionally, those with common knowledge in the art should be able to operate the charge storage units 128, 130, 134 in the memory cell 166 according to the operation method disclosed in the above embodiment, and the details are thus omitted hereinafter.

Figure 3:
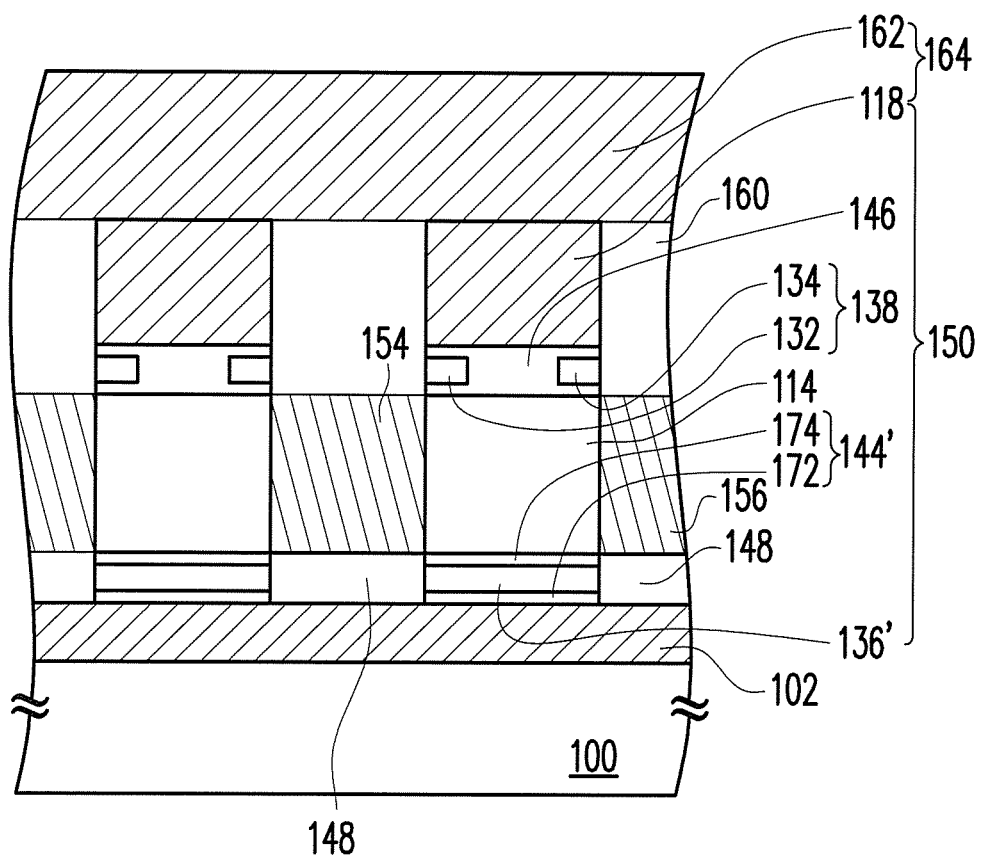
FIGS. 3 and 4 respectively depict cross-sectional views of memory structures shown in a second embodiment and a third embodiment of the invention.
Figure 4:
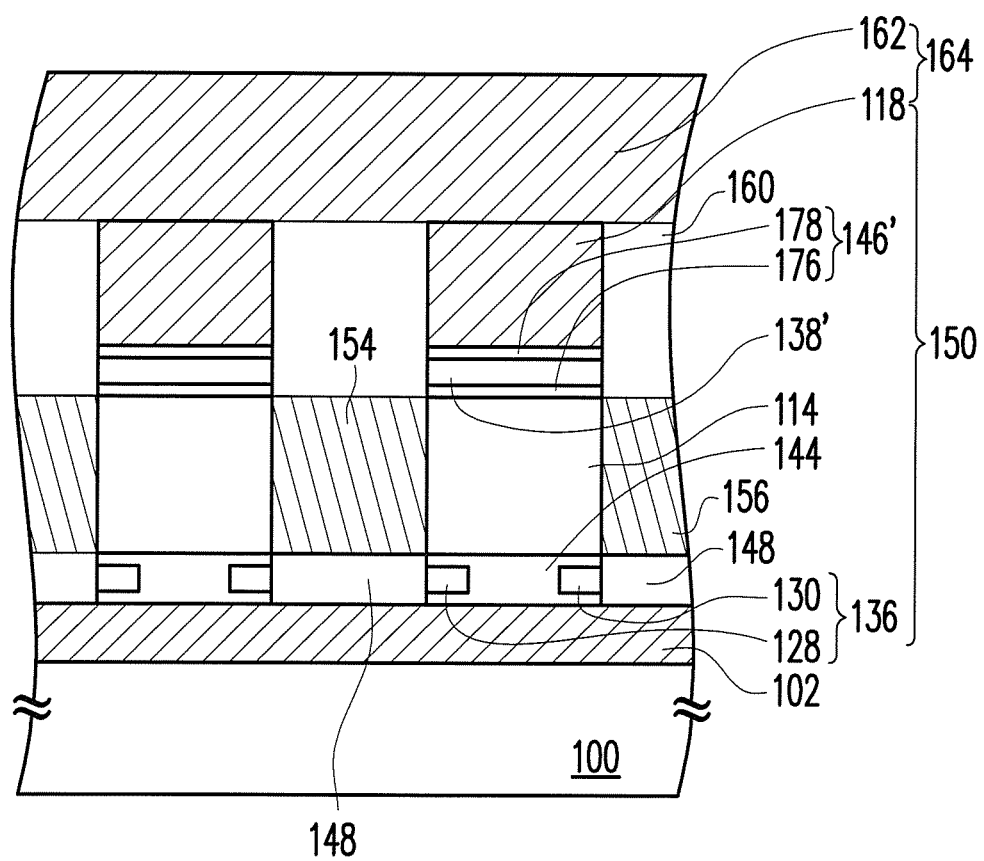

FIGS. 3 and 4 respectively depict cross-sectional views of memory structures shown in a second embodiment and a third embodiment of the invention.

In the first embodiment, the memory structure is illustrated with the two charge storage structures 136, 138 respectively including two charge storage units 128, 130 and 132, 134 which are physically separated in the memory cell 166. However, the scope of the invention is not limited thereto, the protection scope of the invention applies as long as at least one of the charge storage structures 136, 138 includes the two charge storage units which are physically separated.

For example, referring to FIGS. 1H and 3 simultaneously, the difference between the memory structures in the first embodiment and the second embodiment is that in the memory structure of the second embodiment, a charge storage structure 136' is a singular charge storage unit and a dielectric structure 144' includes a dielectric layer 172 and a dielectric layer 174. Herein, the dielectric layer 172 is disposed between the gate 102 and the charge storage structure 136', and the dielectric layer 174 is disposed between the charge storage structure 136' and the channel layer 114. The charge storage structure 136' is fabricated using silicon nitride, doped polysilicon, or nano grain, for example. The dielectric layer 172 and the dielectric layer 174 are fabricated with silicon oxide respectively, for instance. Other elements in the second embodiment are similar to those in the first embodiment and the descriptions are thus omitted hereinafter.

Referring to FIGS. 1H and 4 simultaneously, the difference between the memory structures in the first embodiment and the third embodiment is that in the memory structure of the third embodiment, a charge storage structure 138' is a singular charge storage unit and a dielectric structure 146' includes a dielectric layer 176 and a dielectric layer 178. Herein, the dielectric layer 176 is disposed between the channel layer 114 and the charge storage structure 138', and the dielectric layer 178 is disposed between the charge storage structure 138' and the gate 118. The charge storage structure 138' is fabricated using silicon nitride, doped polysilicon, or nano grain, for example. The dielectric layer 176 and the dielectric layer 178 are fabricated with silicon oxide respectively, for instance. Other elements in the third embodiment are similar to those in the first embodiment and the descriptions are thus omitted hereinafter.

Figure 5:
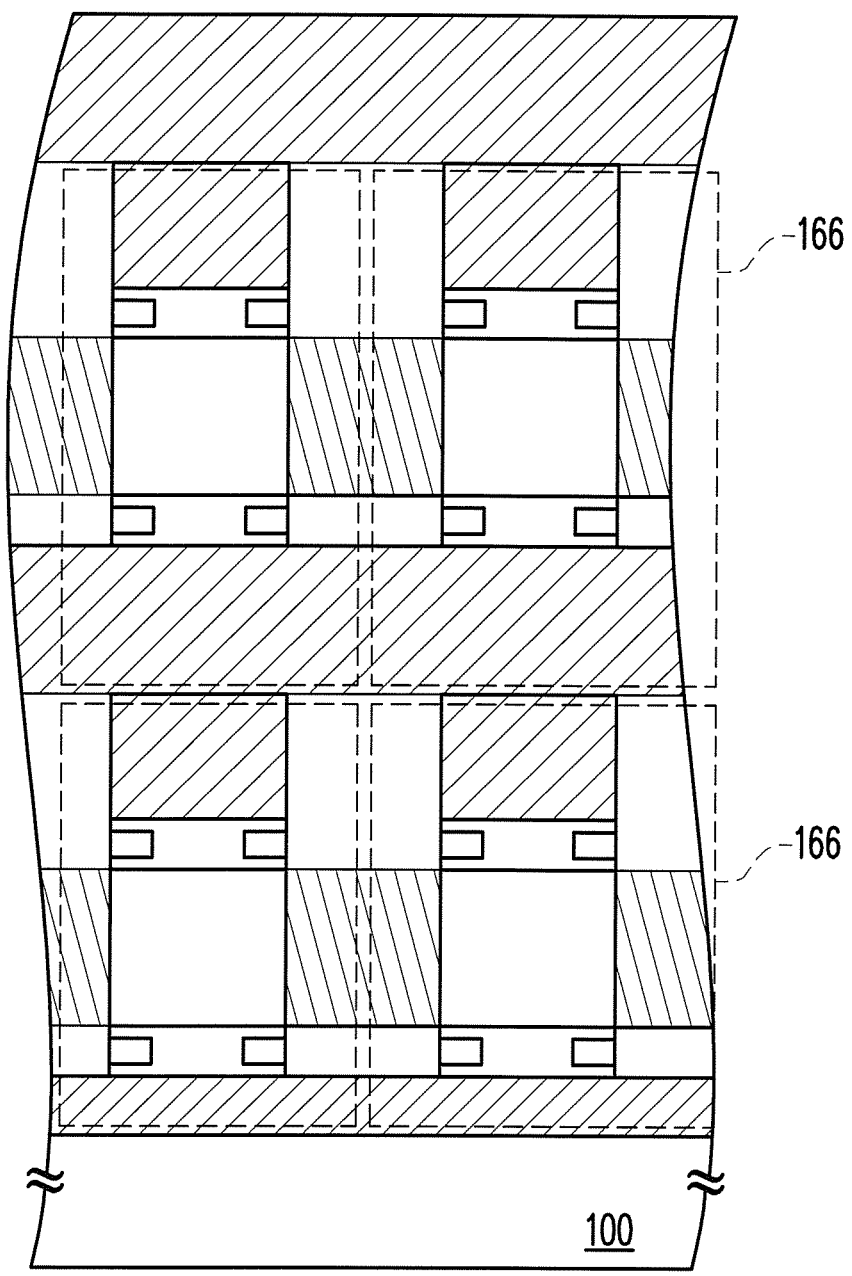
FIG. 5 illustrates a cross-sectional view of a memory structure according to a fourth embodiment of the invention.

FIG. 5 illustrates a cross-sectional view of a memory structure according to a fourth embodiment of the invention.

The difference between the memory structures in the first embodiment and the fourth embodiment is that the memory structure in the fourth embodiment has a plurality of memory cells 166 stacked together, where every two memory cells 166 that are perpendicularly adjacent to each other share a common word line. Other elements in the fourth embodiment are similar to those in the first embodiment and the descriptions are thus omitted hereinafter.

In the fourth embodiment, since the memory structure has a plurality of memory cells 166 which is stacked together, the integrity of the memory device can further be increased.

In summary, the embodiments aforementioned include at least the following advantages.

The memory structure provided in the embodiments aforementioned is capable of solving the reading error caused by the second bit effect and reducing the programming disturbance led by the secondary hot electrode.

The method of fabricating the memory structure illustrated in the above embodiments can be integrated with the conventional fabrication, thereby reducing the fabrication complexity effectively.

The memory structure provided in the embodiments mentioned above can further enhance the integrity of the memory device.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method of fabricating a memory structure, comprising:

forming a first layer, a second layer and a third layer, wherein the second layer is positioned between the first layer and the third layer, the first layer and the third layer have a first material, the second layer has a second material, and the first material is different from the second material, wherein the second layer is a channel layer;

removing a portion of the first layer and a portion of the third layer to form a plurality of openings;

forming a dielectric material layer and a charge storage material layer to fully fill the plurality of openings;

removing a portion of the charge storage material layer to form a plurality of charge storage units, whereby the plurality of charge storage units in the first layer is separated from the plurality of charge storage units in the third layer; and forming a channel output line, wherein the channel output line is connected to the second layer.

2. The method of fabricating the memory structure as claimed in claim 1, wherein the charge storage material layer comprises polysilicon.

3. The method of fabricating the memory structure as claimed in claim 1, wherein removing the portion of the charge storage material layer comprises removing the charge storage material layer located outside of the plurality of openings.

4. The method of fabricating the memory structure as claimed in claim 1, wherein the method of removing the portion of the first layer and the portion of the third layer comprises an etching method.

5. The method of fabricating the memory structure as claimed in claim 4, wherein the etching method comprises a wet etching method.

6. The method of fabricating the memory structure as claimed in claim 1, wherein the method of forming the dielectric material layer and the charge storage material layer comprises:
   forming the dielectric material layer on a plurality of surfaces of the plurality of openings; and
   forming the charge storage material layer filling the plurality of openings.

7. A method of fabricating a memory structure, comprising:
   forming a first layer, a second layer and a third layer, wherein the second layer is positioned between the first layer and the third layer, the first layer and the third layer have a first material, the second layer has a second material, and a material of the first layer is different from a material of the second material, wherein the second layer is a channel layer;
   removing a portion of the first layer and a portion of the third layer to form a plurality of openings;
   forming a dielectric material layer and a charge storage material layer to fully fill the plurality of openings;
   removing a portion of the charge storage material layer, wherein the charge storage material layer between the first layer and the third layer is discontinuous; and
   forming a channel output line, wherein the channel output line is connected to the second layer.

8. The method of fabricating the memory structure as claimed in claim 7, wherein the charge storage material layer comprises polysilicon.

9. The method of fabricating the memory structure as claimed in claim 7, wherein removing the portion of the charge storage material layer comprises removing the charge storage material layer located outside of the plurality of openings.

10. The method of fabricating the memory structure as claimed in claim 7, wherein the method of removing the portion of the first layer and the portion of the third layer comprises an etching method.

11. The method of fabricating the memory structure as claimed in claim 10, wherein the etching method comprises a wet etching method.

12. The method of fabricating the memory structure as claimed in claim 7, wherein the method of forming the dielectric material layer and the charge storage material layer comprises:
    forming the dielectric material layer on a plurality of surfaces of the plurality of openings; and
    forming the charge storage material layer filling the plurality of openings.

13. A method of fabricating a memory structure, comprising:
    forming a first layer, a second layer and a third layer, wherein the second layer is positioned between the first layer and the third layer, the first layer and the third layer have a first material, the second layer has a second material, the first material is a dielectric material, and the second material is a semiconductor material, wherein the second layer is a channel layer;
    removing a portion of the first layer and a portion of the third layer to form a plurality of openings;
    forming a dielectric material layer and a polysilicon charge storage material layer to fill the plurality of openings; and
    forming a channel output line, wherein the channel output line is connected to the second layer.

14. The method of fabricating the memory structure as claimed in claim 13, further comprising removing a portion of the polysilicon charge storage material layer to form a plurality of charge storage units, whereby the plurality of charge storage units in the first layer is separated from the plurality of charge storage units in the third layer.

15. The method of fabricating the memory structure as claimed in claim 14, wherein removing the portion of the polysilicon charge storage material layer comprises removing the polysilicon charge storage material layer located outside of the plurality of openings.

16. The method of fabricating the memory structure as claimed in claim 13, wherein the method of removing the portion of the first layer and the portion of the third layer comprises an etching method.

17. The method of fabricating the memory structure as claimed in claim 16, wherein the etching method comprises a wet etching method.

18. The method of fabricating the memory structure as claimed in claim 13, wherein the method of forming the dielectric material layer and the polysilicon charge storage material layer comprises:
    forming the dielectric material layer on a plurality of surfaces of the plurality of openings; and
    forming the polysilicon charge storage material layer filling the plurality of openings.

* * * * *